(12) United States Patent
Kawahigashi

(10) Patent No.: US 7,492,009 B2
(45) Date of Patent: Feb. 17, 2009

(54) SEMICONDUCTOR DEVICE HAVING SILICON ON INSULATOR STRUCTURE AND METHOD OF FABRICATING THE SAME

(75) Inventor: Syogo Kawahigashi, Kanagawa (JP)

(73) Assignee: Nec Electronics Corporation, Kanagawa (JP)

( * ) Notice: Subject to any disclaimer, the term of this patent is extended or adjusted under 35 U.S.C. 154(b) by 454 days.

(21) Appl. No.: 10/954,217

(22) Filed: Oct. 1, 2004

(65) Prior Publication Data

US 2005/0042808 A1 Feb. 24, 2005

(30) Foreign Application Priority Data

Oct. 3, 2003 (JP) ............................ P2003-345809

(51) Int. Cl.
  H01L 27/01 (2006.01)
  H01L 27/12 (2006.01)
  H01L 31/0392 (2006.01)
  H01L 29/00 (2006.01)
(52) U.S. Cl. ................... 257/347; 257/348; 257/349; 257/350; 257/351; 257/352; 257/353; 257/354; 257/507
(58) Field of Classification Search ......... 257/347–354, 257/507
See application file for complete search history.

(56) References Cited

U.S. PATENT DOCUMENTS

| 5,166,767 A * | 11/1992 | Kapoor et al. ............... 257/518 |
| 5,324,980 A * | 6/1994 | Kusunoki ..................... 257/74 |
| 5,620,908 A * | 4/1997 | Inoh et al. .................... 438/207 |
| 5,751,041 A * | 5/1998 | Suzuki et al. ................. 257/357 |
| 5,888,872 A * | 3/1999 | Gardner et al. ............... 438/300 |
| 5,889,302 A * | 3/1999 | Liu ............................. 257/315 |
| 6,100,567 A * | 8/2000 | Burr ............................. 257/365 |
| 6,121,659 A * | 9/2000 | Christensen et al. ......... 257/347 |
| 6,121,661 A * | 9/2000 | Assaderaghi et al. ......... 257/355 |
| 6,414,371 B1* | 7/2002 | Freeman et al. .............. 257/584 |
| 6,429,070 B1* | 8/2002 | Gonzalez et al. ............. 438/253 |
| 6,429,484 B1* | 8/2002 | Yu ............................... 257/347 |
| 6,437,405 B2* | 8/2002 | Kim ............................ 257/347 |
| 6,476,374 B1* | 11/2002 | Kozlowski et al. ......... 250/214.1 |
| 6,555,874 B1* | 4/2003 | Hsu et al. .................... 257/347 |
| 6,566,713 B2* | 5/2003 | Nii .............................. 257/347 |
| 6,586,284 B2* | 7/2003 | Kim ............................. 438/149 |
| 6,614,109 B2* | 9/2003 | Cordes et al. ................ 257/712 |
| 6,627,953 B1* | 9/2003 | Vu et al. ...................... 257/347 |
| 6,638,834 B2* | 10/2003 | Gonzalez ..................... 438/455 |
| 6,734,498 B2* | 5/2004 | Keshavarzi et al. .......... 257/347 |

(Continued)

FOREIGN PATENT DOCUMENTS

JP 2002-110950 A 4/2002

(Continued)

Primary Examiner—Ida M Soward
(74) Attorney, Agent, or Firm—Sughrue Mion, PLLC

(57) ABSTRACT

A semiconductor device capable of making an effective use of a support substrate as interconnect is proposed. The semiconductor device (chip 4) of the present invention has a first Si substrate 1 as a support substrate and a second Si substrate 3 which is layered on a first insulating film layered on one main surface of the first Si substrate 1. A diffusion layer 2 used as a support substrate interconnect is formed at least in a part of the surficial portion of the first Si substrate 1 on the side thereof in contact with the first $SiO_2$ film 9.

12 Claims, 11 Drawing Sheets

U.S. PATENT DOCUMENTS

| | | | |
|---|---|---|---|
| 6,794,716 B2 * | 9/2004 | Park et al. | 257/347 |
| 6,815,771 B2 * | 11/2004 | Kimura | 257/347 |
| 6,882,010 B2 * | 4/2005 | Bhattacharyya | 257/350 |
| 6,909,110 B2 * | 6/2005 | Park et al. | 257/40 |
| 6,919,236 B2 * | 7/2005 | Wei et al. | 438/149 |
| 6,930,357 B2 * | 8/2005 | Kang | 257/347 |
| 7,061,050 B2 * | 6/2006 | Fazan et al. | 257/348 |
| 2001/0033001 A1 * | 10/2001 | Kato | 257/347 |
| 2002/0025604 A1 * | 2/2002 | Tiwari | 438/118 |
| 2003/0203546 A1 * | 10/2003 | Burbach et al. | 438/151 |
| 2005/0282304 A1 * | 12/2005 | Inoue et al. | 438/29 |

FOREIGN PATENT DOCUMENTS

| | | |
|---|---|---|
| KR | 1998-068093 A | 10/1998 |
| KR | 2000-0010131 A | 2/2000 |

* cited by examiner

SEMICONDUCTOR DEVICE HAVING SILICON ON INSULATOR STRUCTURE AND METHOD OF FABRICATING THE SAME

This application is based on Japanese patent application No. 2003-345809, the content of which is incorporated hereinto by reference.

BACKGROUND OF THE INVENTION

1. Field of the Invention

The present invention relates to a semiconductor device, and more specifically to a semiconductor device having so-called SOI (silicon on insulator) structure.

2. Description of the Related Art

There are known conventional semiconductor devices having a substrate structure of the chip thereof based on so-called SOI structure. The SOI structure can be formed by techniques such as the SIMOX (separation by implanted oxygen) process including oxygen ion implantation and bonding process of silicon substrates, and is typically configured as exemplified by a chip 110 shown in FIGS. 8A and 8B, in which an insulating film 303 and a second Si substrate 302, as a single crystal semiconductor substrate, are layered in this order on a first Si substrate 301 as a support substrate.

The semiconductor device using the SOI structure (referred to as SOI semiconductor device, hereinafter) is preferably applicable to high-voltage-resistance applications. Similarly to the general semiconductor devices, the SOI semiconductor device is typically configured so that a chip thereof is mounted on an island of a package using a conductive adhesive or the like, and so that the external connection electrodes on the chip are respectively bonded to predetermined external terminals through wire bonding. Also the island is connected with any one of the external terminals (a grounding terminal in most cases), so that the support substrate in this case can be grounded through the island.

In response to demands for higher integration in the mounting, there are trends in adopting mounting methods or assembling methods, such as chip-on-board (referred to as COB, hereinafter) based on flip-chip technique and tape carrier package (referred to as TCP, hereinafter) also for the aforementioned SOI semiconductor devices, wherein, as typically shown in FIG. 8A, external connection electrodes (not shown) disposed on the second Si substrate 302 of the chip 110 are connected through bumps 201 to conductive interconnects 71 on a wiring substrate 70 on which the chip 110 is mounted, or, as typically shown in FIG. 8B, the external connection electrodes (not shown) disposed on the second Si substrate 302 of the chip 110 are connected to inner leads 80 of a TCP through the bumps 201. This, however, undesirably makes it difficult to apply potential to a first Si substrate 301.

The support substrate set at a floating potential raises a problem typically in that potential variation of the support substrate adversely affects operation of the device, in particular threshold potential, to thereby reduce operational margin of the device. It is also to be noted that voltage resistance of the device varies depending on potential of the support substrate, so that any variation in the potential of the support substrate during operation of the semiconductor device may cause malfunction of the device due to lowering in the voltage resistance thereof.

As one technique of avoiding floating potential of the support substrate, Patent Publication Laid-Open 2002-110950 typically discloses an exemplary SOI semiconductor device capable of applying potential from the surface of the device side to the support substrate.

FIG. 9 is a drawing for explaining the conventional semiconductor device disclosed in Patent Publication Laid-Open 2002-110950, and more specifically a schematic sectional view showing an essential portion of a chip owned by the semiconductor device. FIGS. 10A and FIG. 10B are enlarged views showing the portion "X" and portion "Y", respectively, shown in FIG. 9. FIG. 11 is a perspective plan view schematically showing the chip. FIG. 9 shows a section taken along the line A-A' in FIG. 11.

Referring now to FIG. 9 and so forth, the chip owned by the conventional semiconductor device comprises a P-type first silicon (Si) substrate 401 which serves as a support substrate and which has a specific resistance of, for example, $10\Omega\cdot cm$ and thickness of 650 μm, on which a silicon oxide film (referred to as "$SiO_2$ film", hereinafter) 409 of approximately 1 μm thick, as a first insulating film, and a P-type second Si substrate 403 having a specific resistance of $10\Omega\cdot cm$ and a thickness of 5 μm are layered in this order. In the chip the second Si substrate 403 has, formed therein, a plurality of device-forming regions 430 electrically isolated by isolation grooves 417. The chip also has substrate-contact-forming regions 405 having an area of 100 μm² (10 μm×10 μm), as being disposed in appropriate vacant regions on the chip after removing the second Si substrate 403, and a plurality of external connection electrodes 440.

In each of the substrate-contact-forming region 405, there are provided, as shown in FIG. 10A in an enlarged manner, a TEOS oxide film 412 which is an insulating material film formed by using tetraethoxysilane ($Si(OC_2H_5)_4$, referred to as "TEOS", hereinafter) gas, and substrate contact holes 419 which penetrates the $SiO_2$ film 409 and reaches contact regions 418 in the first Si substrate 401. The substrate contact holes 419 are filled with a metal as a conductive material, which is typified by tungsten (W) 406 to thereby configure contacts, and then the external connection electrodes 440 and the first Si substrate 401 are connected through a metal film interconnect, which serves as the support substrate connection wiring, typified by an aluminum (Al) interconnect 408. This makes it possible to apply a potential to the first Si substrate 401 from the external through the external connection electrode 440.

It is to be noted that substrate contact holes 419 in the example shown in FIG. 9 follow the multi-contact structure in which a plurality of minimum-dimension contact holes used in this chip (which are generally minimum-dimension contact holes used in the device-forming region 430) are arranged. Between the $SiO_2$ film 409 and the TEOS oxide film 412, there are provided a field insulating film 410 and a $SiO_2$ film 411.

The external connection electrode 440 is configured by removing a protective oxide film 413 and a protective nitride film 414 which cover the Al wiring 408, so as to form an opening having the Al interconnect 408 exposed therein, by forming thereon an adhesive metal film 415 such as a titanium (Ti) film, and further by forming a bump 407 typically composed of gold (Au). A predetermined region of the protective oxide film 413 has SOG (spin on glass) 416 coated thereon.

Elements necessary for realizing functions of the semiconductor device are formed on the top surface side of the individual device-forming regions 430 (on the surface side opposite to the junction surface with the $SiO_2$ film 409). FIG. 9 and FIG. 10B show, as one example of such element, a field effect transistor (MOSFET, referred to as "MOS", hereinafter) having a source diffusion layer 420, a drain diffusion layer 424, a gate electrode 423, a gate oxide film 421, and sidewall oxide films 422.

In the configuration enabling potential application to the support substrate (first Si substrate) as described in the above, the support substrate per se can be understood as one interconnect layer. It is therefore expected that use of the support substrate as one of interconnect layers for power source wiring, through which an extremely large current must be handled, makes it possible to correspondingly shrink an area necessary for forming the power source wiring on the surface of the single crystal semiconductor substrate (second Si substrate), and this is highly expectable for shrinkage in the chip size.

A problem, however, resides in that the support substrate (first Si substrate) per se, although having a conductivity, has a resistance larger than that of the aluminum interconnect formed on the surface of the single crystal semiconductor substrate (second Si substrate). Use of the support substrate in its intact form as the interconnect layer, therefore, results in that most portion of the current flows through the aluminum interconnect on the single crystal semiconductor substrate (second Si substrate) having a resistivity smaller than that of the support substrate (first Si substrate), rather than through the support substrate (first Si substrate), and this makes the support substrate less effective as the interconnect layer.

Another problem resides in that the support substrate (first Si substrate) in the conventional configuration is available only as a single kind of interconnect layer, because the entire portion of the support substrate is set to a single potential.

SUMMARY OF THE INVENTION

It is therefore an object of the present invention to provide a semiconductor device and a method of fabricating the same, making an effective use of the support substrate as the interconnect layer.

A semiconductor device of the present invention for the purpose of accomplishing the aforementioned object comprises a first semiconductor substrate as a support substrate, and a second semiconductor substrate which is layered on a first insulating film layered on one main surface of the first semiconductor substrate, wherein a diffusion layer is formed at least in a part of the surficial portion of the first semiconductor substrate on the side thereof in contact with the first insulating film.

In the semiconductor device of the present invention, the diffusion layer formed in the surficial portion of the first semiconductor substrate has a resistivity smaller than that of the first semiconductor substrate, and therefore can be used as a support substrate interconnect. By using the diffusion layer as the support substrate interconnect as described in the above, it is made possible to make an effective use of the first semiconductor substrate, which is the support substrate, as the interconnect layer.

The semiconductor device of the present invention may also be configured as further comprising a substrate-contact-forming region from which a part of the second semiconductor substrate is removed; a contact hole opened on the first semiconductor substrate so as to penetrate the first insulating film exposed in the substrate-contact-forming region; and a support substrate interconnect disposed on the second semiconductor substrate so as to connect with the first semiconductor substrate through a contact configured by filling the contact hole with a conductive material. This configuration allows connection between the interconnect composed of the diffusion layer formed in the first semiconductor substrate and the support substrate interconnect on the second semiconductor substrate, and makes it possible to reduce the interconnect area which must otherwise be ensured on the top surface side of the second semiconductor substrate, by an amount expected from the amount of interconnect composed of the diffusion layer formed in the surficial portion of the first semiconductor substrate. This consequently makes it possible to downsize the semiconductor device.

The contact hole may be configured so as to include a first contact hole opened in the region of the first semiconductor substrate having the diffusion layer formed therein, and a second contact hole opened in the region of the first semiconductor substrate not having the diffusion layer formed therein. The support substrate interconnect may be configured so as to include a first support substrate connection wiring connected to the contact configured in the first contact hole, and a second support substrate interconnect connected to the contact configured in the second contact hole.

This configuration makes it possible to use both of the diffusion layer in the first semiconductor substrate to which the first support substrate interconnect is connected through the contact in the first contact hole, and the region of the first semiconductor substrate not having the diffusion layer formed therein, but to which the second support substrate interconnect is connected through the contact in the second contact, as the interconnect layers differing from each other. This consequently makes it possible to use the diffusion layer in the first semiconductor substrate typically as power source wiring or signal wiring, and to use the region of the first semiconductor substrate not having the diffusion layer formed therein typically for potential fixation of the first semiconductor substrate.

It is also allowable to adopt a configuration in which at least either one of the first support substrate interconnect and the second support substrate interconnect is connected with an external connection electrode.

A method of fabricating a semiconductor device of the present invention is a method of fabricating a semiconductor device which comprises a first semiconductor substrate as a support substrate, a second semiconductor substrate which is layered on a first insulating film layered on one main surface of the first semiconductor substrate, and a diffusion layer formed at least in a part of the surficial portion of the first semiconductor substrate on the side thereof in contact with the first insulating film; wherein the method comprises a step of forming the diffusion layer at least in a part of the surficial portion of the first semiconductor substrate; forming the first insulating film on the exposed portion of the first semiconductor substrate and on the diffusion layer; and layering the second semiconductor substrate on the first insulating film.

In the step of forming the diffusion layer, the diffusion layer may be formed in a stripe pattern.

This configuration makes it possible to obtain a semiconductor device which makes an effective use of the support substrate as a interconnect layer.

In particular by forming the diffusion layer in a stripe pattern, it is made possible to prevent the plurality of independent diffusion layers formed in the first semiconductor substrate from coupling with each other by annealing for stacking the second semiconductor substrate.

The method of fabricating a semiconductor device of the present invention may further comprise a step of forming a substrate-contact-forming region by removing a part of the second semiconductor substrate; forming a contact hole opened on the first semiconductor substrate so as to penetrate the first insulating film exposed in the substrate-contact-forming region; and configuring a contact by filling the contact hole with a conductive material; and forming a support substrate interconnect on the second semiconductor substrate so as to connect with the first semiconductor substrate through the contact.

The contact hole may be configured so as to include a first contact hole opened in the region of the first semiconductor substrate having the diffusion layer formed therein, and a second contact hole opened in the region of the first semiconductor substrate not having the diffusion layer formed therein. It is also allowable to configure the support substrate interconnect so as to include a first support substrate interconnect connected to the contact configured in the first contact hole, and a second support substrate connection wiring connected to the contact configured in the second contact hole.

It is also allowable to adopt a configuration further comprising a step of forming an external connection electrode connected to at least either one of the first support substrate interconnect and the second support substrate connection wiring.

A method of fabricating a semiconductor device of the present invention is a method of fabricating a semiconductor device which comprises a first semiconductor substrate as a support substrate and a second semiconductor substrate which is layered on a first insulating film layered on one main surface of the first semiconductor substrate, wherein the method comprises a step of forming a diffusion layer at least in a part of the surficial portion of the first semiconductor substrate on the side thereof in contact with the first insulating film.

A semiconductor device including silicon on insulator (SOI) structure of the present invention comprises: a support substrate; a wiring layer, formed on said support substrate; an insulating layer formed on said support substrate and said wiring layer, said insulating layer being provided as a part of said SOI; a semiconductor substrate formed as a part of said SOI on said insulating layer, said semiconductor substrate having a first element and a first external terminal thereon, said element and said external terminal being coupled to said wiring layer.

As has been described in the above, because the diffusion layer is formed at least in a part of the surficial portion of the first semiconductor substrate on the side thereof in contact with the first insulating film, the diffusion layer can be used as the support substrate interconnect, and this makes an effective use of the first semiconductor substrate as the interconnect layer.

BRIEF DESCRIPTION OF THE DRAWINGS

FIG. 8A shows COB mounting, and FIG. 8B shows TCP assembling;

DETAILED DESCRIPTION OF THE INVENTION

Embodiments of the present invention will be described in the next, referring to the attached drawings.

Figure 1:
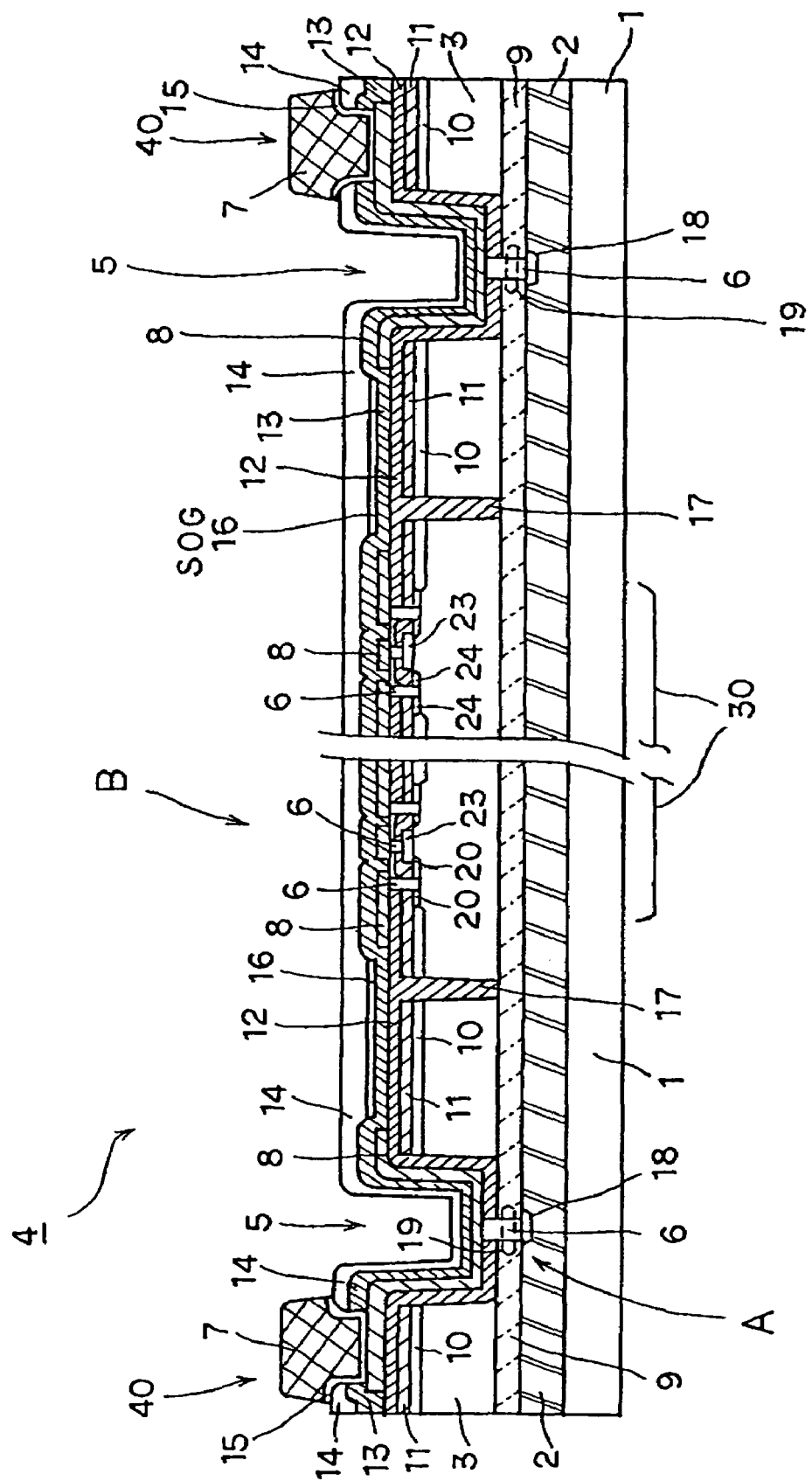
FIG. 1 is a drawing for explaining one embodiment of a semiconductor device of the present invention, and more specifically a schematic sectional view showing an essential portion of the semiconductor device.
Figure 2A:
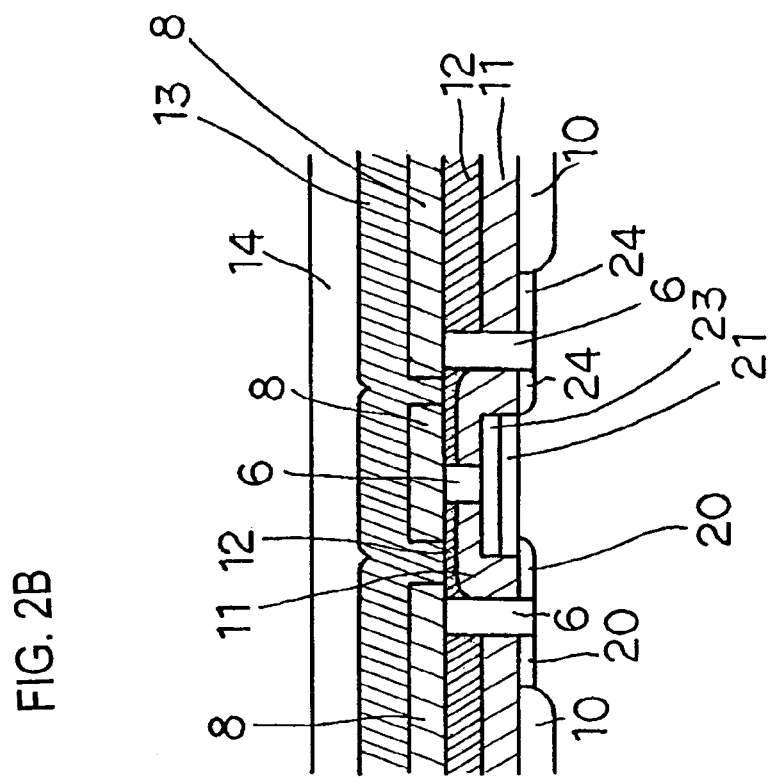
FIG. 2A and FIG. 2B are enlarged views showing the portion "A" and portion "B", respectively, shown in FIG. 1.
Figure 2B:
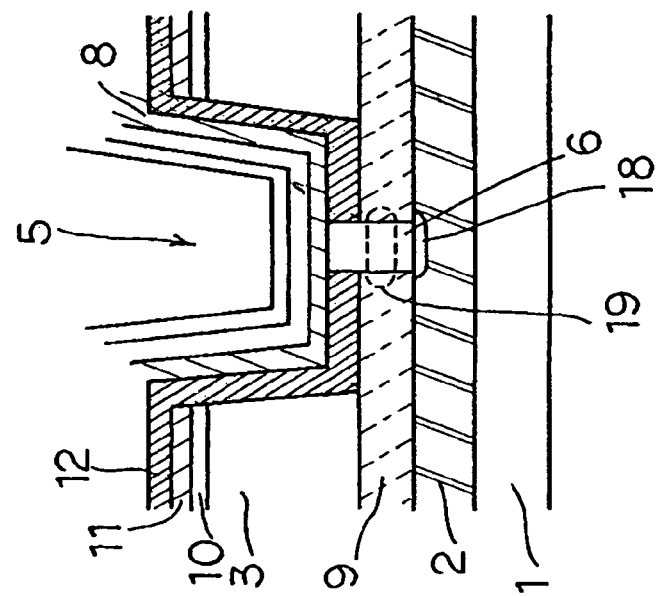
Figure 3:
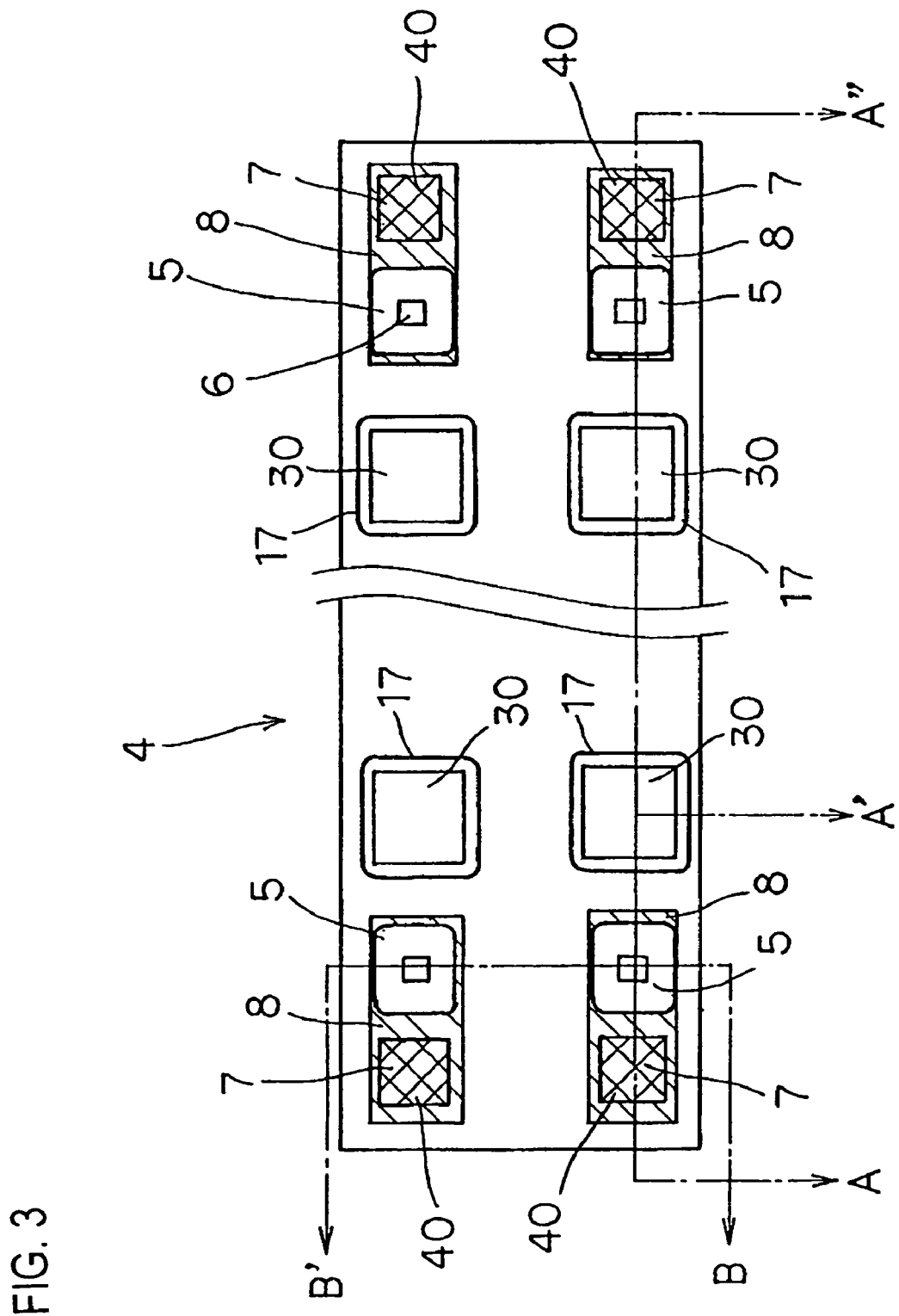
FIG. 3 is a perspective plan view schematically showing the semiconductor device shown in FIG. 1.

FIG. 1 is a drawing for explaining one embodiment of a semiconductor device of the present invention, and more specifically a schematic sectional view showing an essential portion of the semiconductor device. FIG. 2A is an enlarged view showing the portion "A" shown in FIG. 1, and FIG. 2B is an enlarged view showing the portion "B" shown in FIG. 1. FIG. 3 is a perspective plan view schematically showing the semiconductor device shown in FIG. 1. FIG. 1 shows a section taken along the A-A' line in FIG. 1.

As shown in FIG. 1 and FIGS. 2A and 2B, the semiconductor device (chip 4) of the present embodiment has a diffusion layer 2 in the surficial portion of the first Si substrate 1, which is a support substrate, on the side thereof in contact with a $SiO_2$ film 9, which is a first insulating film. The diffusion layer 2 is composed of a semiconductor heavily doped with an impurity, and made into $N^+$-type when the first Si substrate 1 has a P-type conductivity, and made into $P^+$-type when the first Si substrate 1 has an N-type conductivity.

In a substrate-contact-forming region 5 in the present embodiment, as specifically shown in FIG. 2A in an enlarged manner, a TEOS oxide film 12 which is an insulating material layer formed by using TEOS gas, and substrate contact hole 19 penetrating the $SiO_2$ film 9 and reaching a contact region 18 in the diffusion layer 2 are provided. The substrate contact hole 19 is filled for example with tungsten (W) 6, which is a metal as a conductive material, to thereby configure a contact, in which an external connection electrode 40 and the diffusion layer 2 formed in the surficial portion of the first Si substrate 1 are connected with, for example, an aluminum (Al) interconnect 8, which is a metal film interconnect serving as the support substrate interconnect. This makes it possible to use the diffusion layer 2 as a heavily-doped, low-resistivity support substrate interconnect.

Figure 8A:
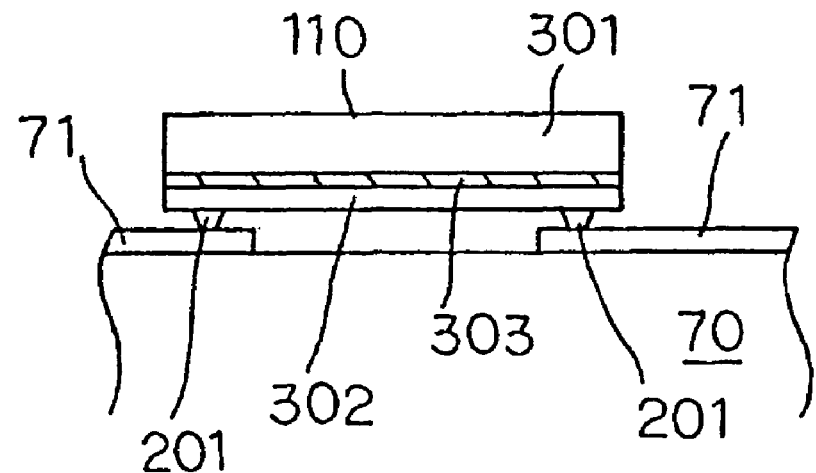
FIG. 8A and FIG. 8B are schematic drawings showing states of mounting and assembling of an SOI semiconductor device, where
Figure 8B:
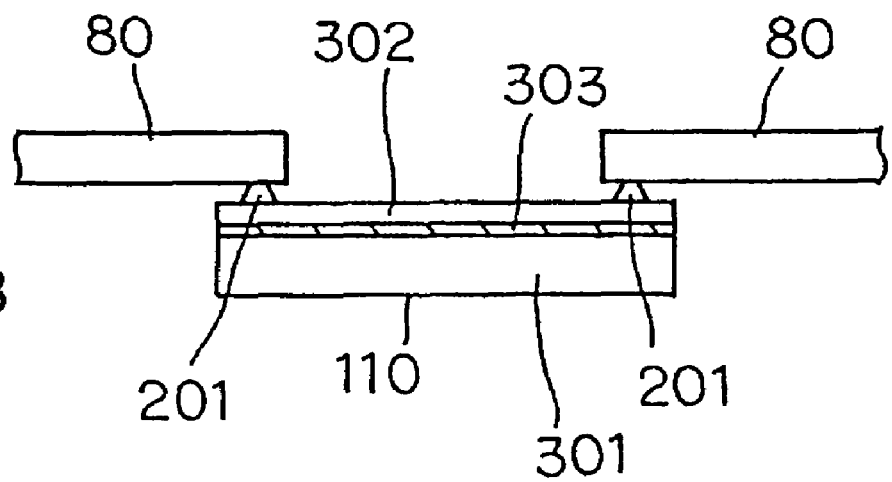
Figure 9:
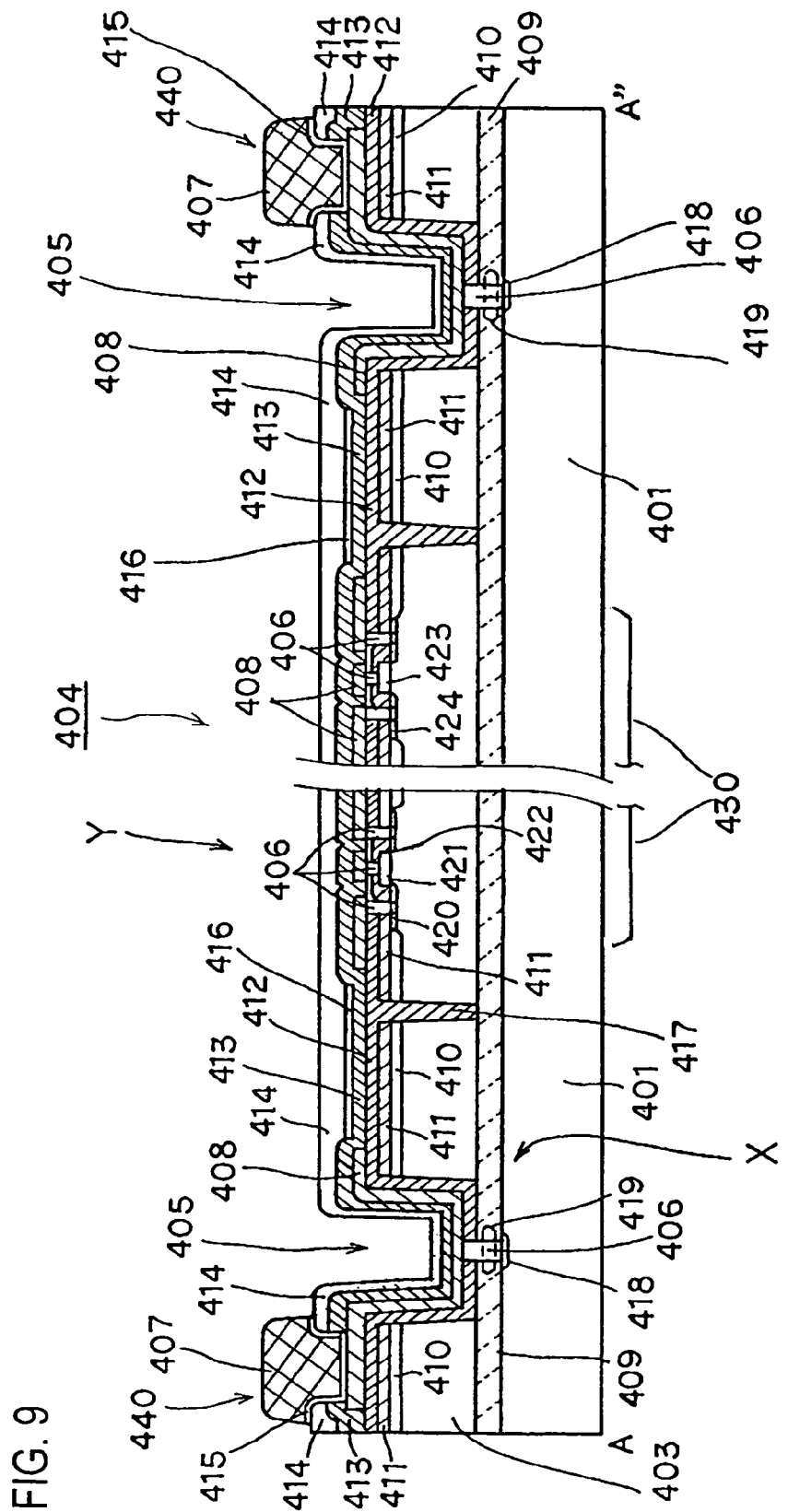
FIG. 9 is a drawing for explaining a conventional semiconductor device, and more specifically a schematic sectional view showing an essential portion of the semiconductor device.
Figure 10A:
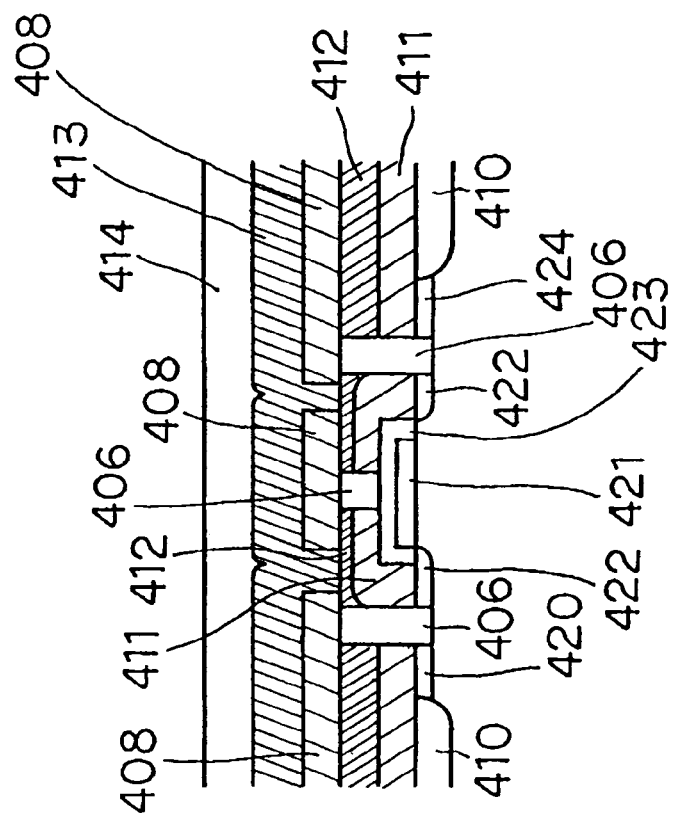
FIG. 10A and FIG. 10B are enlarged views showing the portion "X" and portion "Y", respectively, shown in FIG. 9.
Figure 10B:
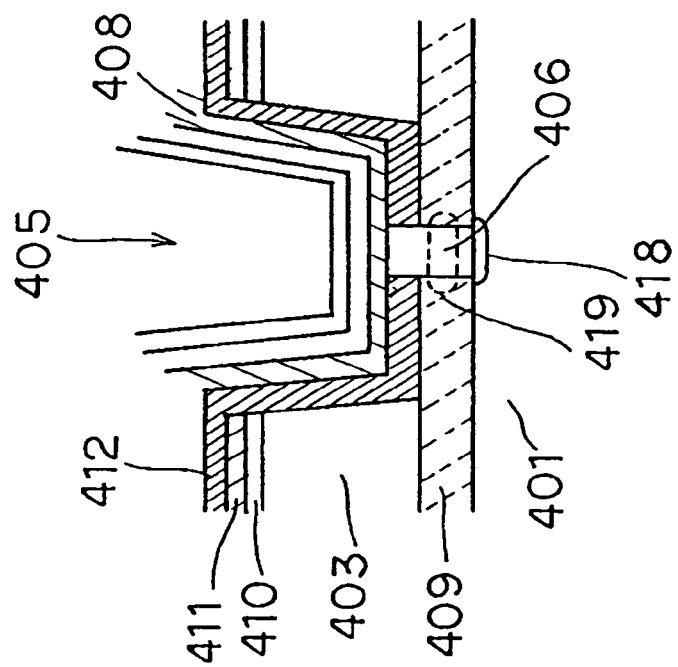
Figure 11:
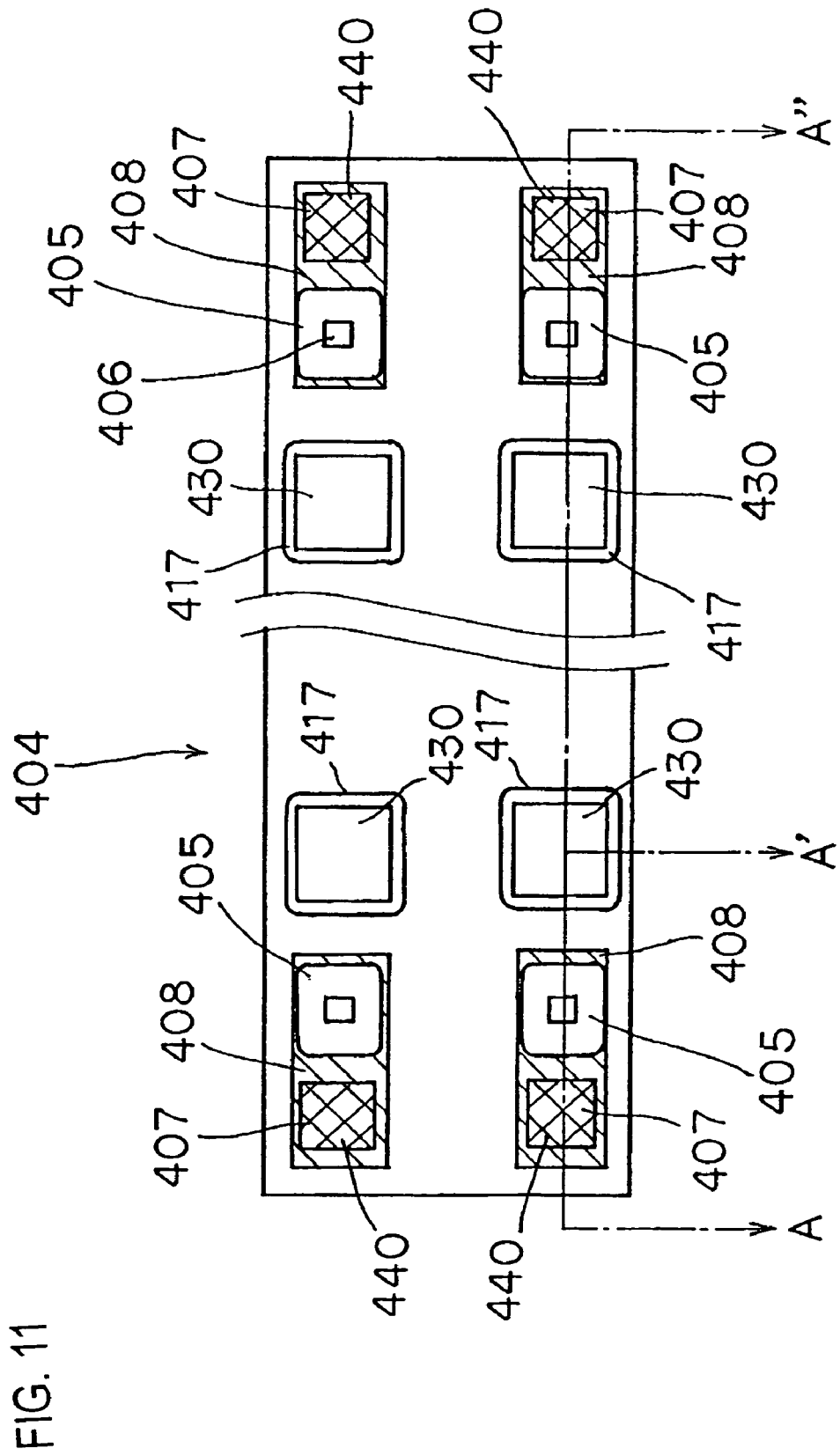
FIG. 11 is a perspective plan view schematically showing the semiconductor device shown in FIG. 9.

Other configurations of the semiconductor device shown in FIG. 1 to FIG. 3 are same as those of the conventional semiconductor device shown in FIG. 8 and so forth, so that the configuration will not be detailed hereinafter.

Figure 4A:
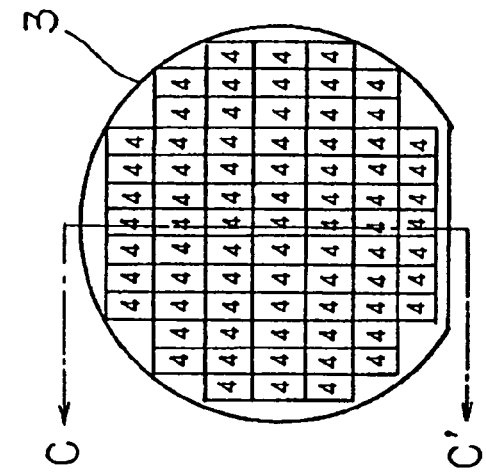
FIGS. 4A to 4C are plan views showing a part of process steps of fabricating the semiconductor device shown in FIG. 1 and so forth.
Figure 4B:
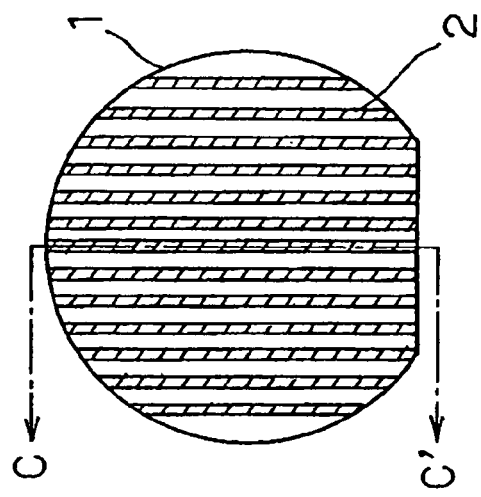
Figure 4C:
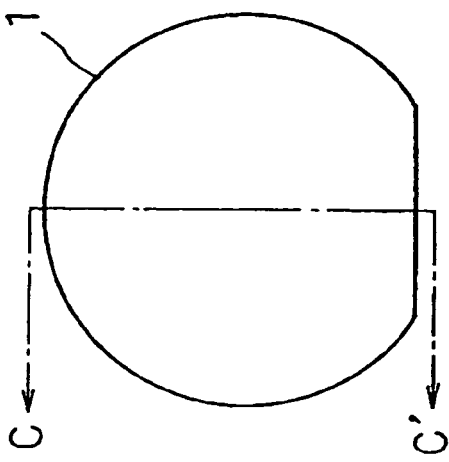

Next, a method of fabricating the semiconductor device shown in FIG. 1 and so forth will be explained. FIGS. 4A to 4C are plan views explaining a part of process steps of fabricating the semiconductor device shown in FIG. 1 and so forth, and FIGS. 5A to 5D are sectional views taken along the C-C' line of the individual substrates and so forth respectively shown in FIGS. 4A to 4C.

Figure 5A:
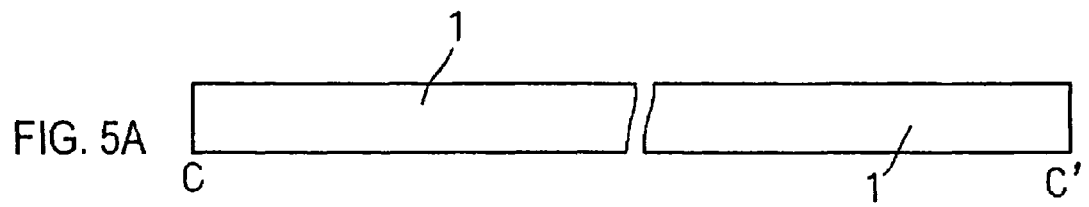
FIGS. 5A to 5D are sectional views taken along the C-C' line of the individual substrates and so forth shown in FIGS. 4A to 4C.
Figure 5B:
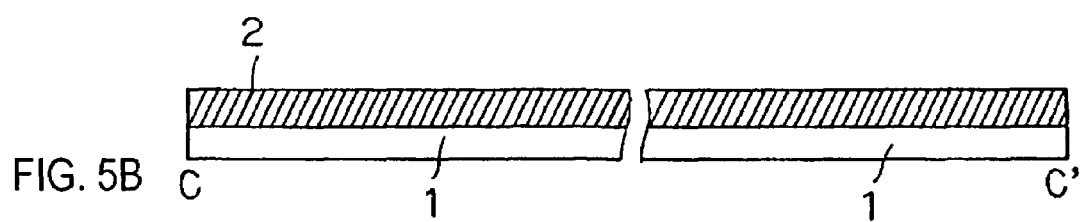
Figure 5C:
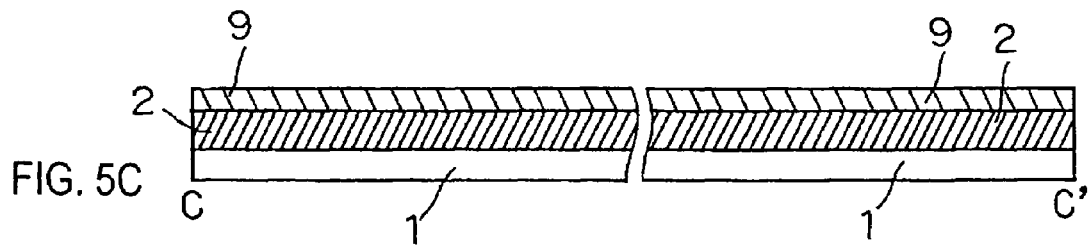

First, in the surficial portion of the wafer-formed first Si substrate 1 formed as shown in FIG. 4A and FIG. 5A, the diffusion layer 2 is formed in a stripe pattern as shown in FIG. 4B and FIG. 5B. The first Si substrate 1 having a P-type conductivity will have an N$^+$-type diffusion layer 2 formed therein, and the first Si substrate 1 having an N-type conductivity will have a P$^+$-type diffusion layer 2 formed therein. In the formation of the diffusion layer 2, it is preferable to preliminarily consider the surface orientation of the first Si substrate 1, and to determine position of formation of the diffusion layer 2 over the first Si substrate 1 based on chip layout and wafer shot map.

The diffusion layer 2 formed in the first Si substrate 1 will inevitably spread to a certain degree during annealing which is carried out later for the purpose of bonding the first Si substrate 1 and the second Si substrate 3. It is therefore necessary to preliminarily estimate, through simulation, a possible degree of spreading of the diffusion layer 2, and to sufficiently space the every adjacent diffusion layers 2 from each other taking a margin of the spreading into consideration, so as to avoid coupling by spreading of the adjacent diffusion layers 2 in a stripe pattern.

Figure 5D:
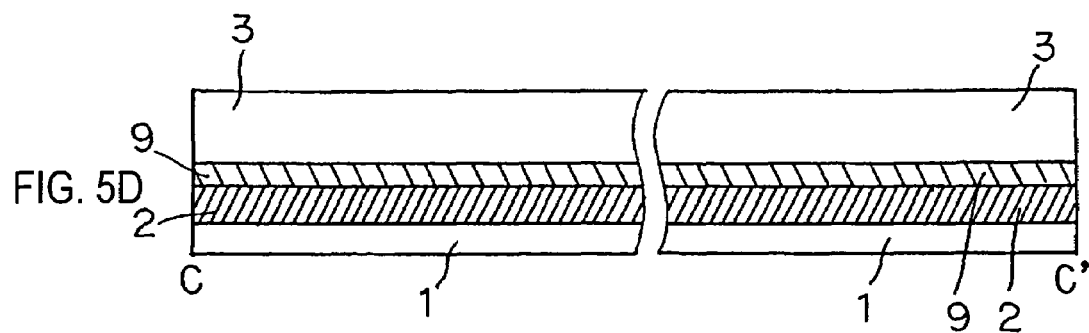

Next, on thus formed first Si substrate 1, the SiO$_2$ film 9 as an insulating film is formed (FIG. 5C), and further on the SiO$_2$ film 9, the second Si substrate 3 is stacked (FIG. 4C, FIG. 5D).

Referring now back to FIG. 1 and FIGS. 2A, 2B, on thus formed second Si substrate 3, a field insulating film 10 and necessary elements are formed by publicly-known methods. The present embodiment shows, as one example of such elements, a field effect transistor (MOSFET, referred to as "MOS", hereinafter) having a source diffusion layer 20, a drain diffusion layer 24, a gate electrode 23, and a gate oxide film 21 (see particularly FIG. 2B).

The element is thus connected to the external connection electrode 40 through the aluminum interconnect 8 and also to the diffusion layer 2 through the aluminum interconnect 8 and tungsten 6 as a plug.

Then, on the field insulating film 10 and the elements, a SiO$_2$ film 11 as the second insulating film is formed by the chemical vapor deposition (referred to as CVD, hereinafter) process.

A photoresist (not shown) is coated thereon, the coated film is subjected to light exposure through a predetermined reticle (not shown) and developed, to thereby form openings for forming isolation grooves of a predetermined width for isolating device-forming regions 30, and openings for forming substrate-contact-forming regions. The SiO$_2$ film 11 and the field oxide film 10 exposed in these openings are then removed by a publicly-known etching technique, to thereby expose the second Si substrate 3.

Next, the photoresist is removed, and the exposed portion of the second Si substrate 3 is then removed by an isotropic etching technique through the SiO$_2$ film 11 as an etching mask, to thereby form the isolation grooves 17 and substrate-contact-forming regions 5, so as to allow the SiO$_2$ film 9 to expose therein. The isolation grooves 17 and the substrate-contact-forming regions 5 herein are formed so as to have the sidewalls slightly inclined so that the upper ends of the openings will be larger than the individual bottoms thereof where the SiO$_2$ film 9 is exposed.

Then, the TEOS oxide film 12, which serves as an insulating material for filling the isolation grooves 17, is deposited over the entire surface by the reduced-pressure CVD (LPCVD) process using TEOS gas, to thereby completely fill the isolation groove 17.

The entire portion of the TEOS oxide film 12 deposited over the entire surface is etched back so as to reduce steps generated on the device-forming region 30, to thereby planarize the region.

Then, a photoresist (not shown) is first coated on the entire surface, the coated film is subjected to light exposure through a reticle (not shown) having a pattern of the substrate contact hole 19 formed thereon, and the pattern of the substrate contact hole 19 is developed to thereby form a pattern of the substrate contact hole 19 to be connected to the first Si substrate 1, at a predetermined position in the substrate-contact-forming region 5. The TEOS oxide film 12, SiO$_2$ film 11 and the SiO$_2$ film 9 are then removed by etching to thereby open the substrate contact hole 19 which reaches the first Si substrate 1, and thereafter the photoresist is removed.

Next, a photoresist (not shown) is coated over the entire surface, the coated film is subjected to light exposure through a reticle (not shown) having a pattern of contact holes to be connected to the individual elements formed in the device-forming region 30, and the pattern of the contact holes is developed to thereby form a contact-hole-forming pattern. The TEOS oxide film 12 and SiO$_2$ film 11 are then removed by etching to thereby open the contact holes, and thereafter the photoresist is removed.

Then, the individual contact regions 18 are doped with a predetermined amount of impurity depending on needs.

Tungsten is deposited over the entire surface by the CVD process to thereby fill the substrate contact hole 19 and the contact holes in the device-forming region 30, and the entire surface of tungsten is then etched back to thereby remove the portion of tungsten on the flat portion of the TEOS oxide film 12. This allows tungsten 6 to remain as a filled metal in the individual contact holes, and thereby portion of the contact holes are planarized. It is to be noted herein that tungsten 6 remains also on the sidewall portions of the substrate-contact-forming region 5.

Aluminum as a conductive material for interconnect is deposited over the entire surface to a predetermined thickness by the sputtering process.

Next, a photoresist (not shown) is coated over the entire surface, the coated film is subjected to light exposure through a reticle (not shown) having a predetermined interconnect pattern and developed, and the aluminum layer is removed in the region other than the interconnect portion typically by a publicly-known dry etching technique, to thereby form the aluminum interconnect 8 which serves as the support substrate interconnect for connecting the first Si substrate 1 and a predetermined external connection electrode 40, and as a predetermined internal interconnect.

Finally, a SiO$_2$ film for protecting the aluminum interconnect 8 is deposited over the entire surface to thereby form a protective oxide film 13. Further on the protective oxide film 13, SOG (spin on glass) 16 is coated, cured by heating, and the entire surface of which is etched back until the flat portion of the protective oxide film 13 exposes, to thereby moderate the surface irregularity. A silicon nitride film (Si$_3$N$_4$ film) is further deposited to thereby form a protective nitride film 14. The protective nitride film 14 can be substituted by a silicon oxinitride film (SiON film). An external connection electrode-forming opening is then opened using a publicly-known photolithographic technique and an etching technique, an adhesive metal film 15 is formed so as to cover the opening, and a bump 7 is formed thereon, and thereby the wafer process comes to the end.

After completion of the above-described wafer process, dicing is carried out so as to obtain separated chips 4.

Figure 6:
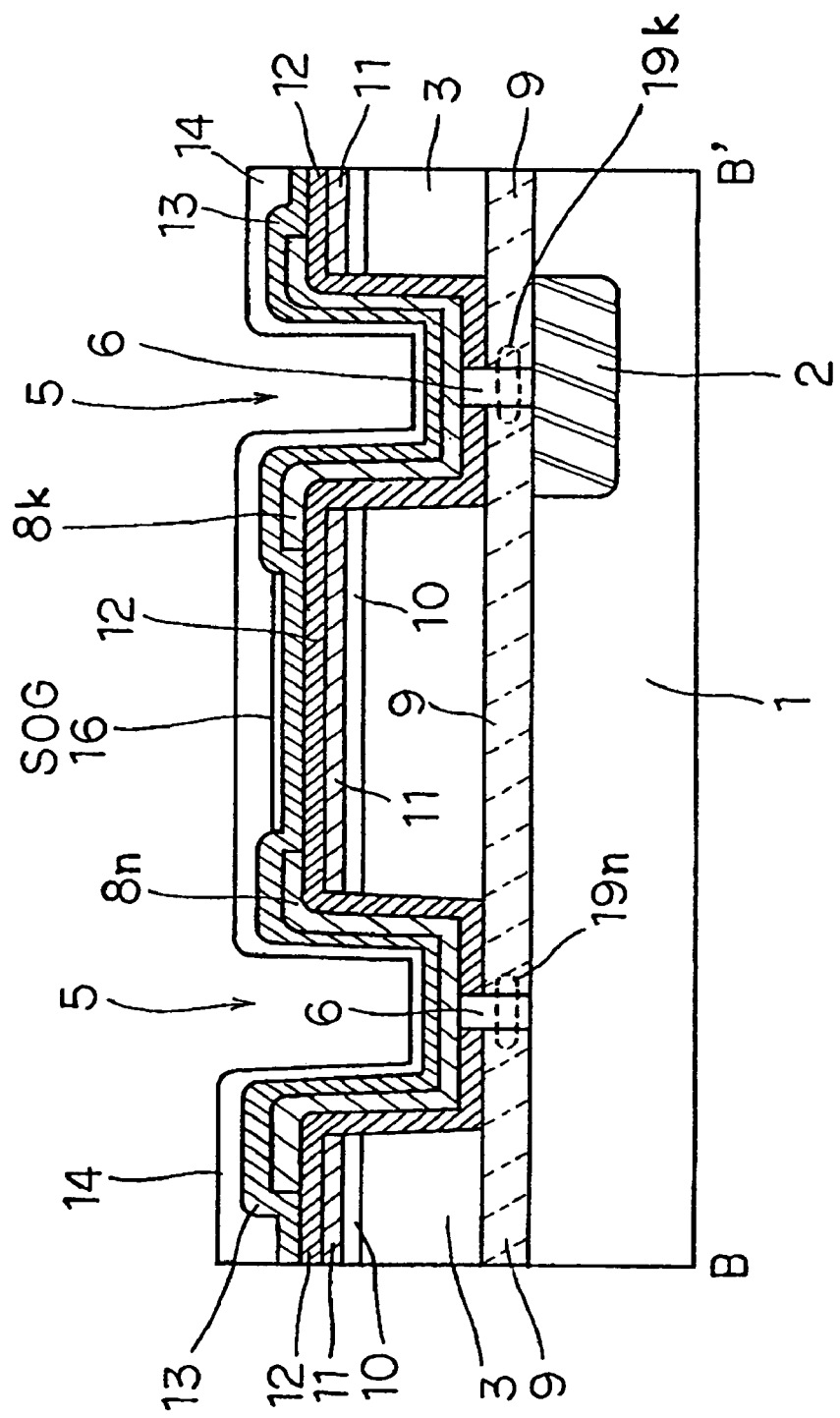
FIG. 6 is a sectional view taken along the B-B' line shown in FIG. 3.

FIG. 6 is a sectional view taken along the B-B' line in FIG. 3.

As for the substrate contact hole 19, it is advantageous to discriminate, as shown in FIG. 6, a first substrate contact hole 19k which couples a region of the first Si substrate having the diffusion layer 2 formed therein, and a second substrate contact hole 19n which couples a region not having the diffusion layer 2 formed therein, because this makes it possible to use the first Si substrate 1 and diffusion layer 2 as different kinds of interconnects, such as using the interconnect composed of the diffusion layer 2, connected to a first aluminum interconnect 8k through tungsten 6 (contact) filled in the first substrate contact hole 19k which couples the region having the diffusion layer 2 formed therein, as power source interconnect or as signal interconnect, and such as using the first Si substrate 1 connected to a second aluminum interconnect 8n through tungsten 6 (contact) filled in the second substrate contact hole 19n which couples the region not having the diffusion layer 2 formed therein, as potential fixation of the first Si substrate 1. For the case where it is desired to use the diffusion layer 2 as the power source interconnect or signal interconnect, rather than for grounding, it is necessary for the first Si substrate 1 having a P-type conductivity to be fixed at a potential not higher than that of the diffusion layer 2, whereas it is necessary for the first Si substrate 1 having an N-type conductivity to be fixed at a potential not lower than that of the diffusion layer 2. This way of potential fixation can be achieved by applying potential from the external to the first Si substrate 1 or the diffusion layer 2 through the external connection electrode 40.

As has been described in the above, the semiconductor device of this embodiment makes it possible to use the diffusion layer 2 as a heavily-doped, low-resistivity support substrate interconnect, by forming the $N^+$-type diffusion layer 2 in the P-type first Si substrate 1 or by forming the $P^+$-type diffusion layer 2 in the N-type first Si substrate 1, and by making it couples the substrate contact hole 19 filled with tungsten 6, to thereby establish a connection between the diffusion layer 2 and the external connection electrode 40 through the aluminum interconnect 8. Use of the diffusion layer 2 as a interconnect layer makes it possible to reduce the interconnect region which has otherwise been necessary on the surface side of the second Si substrate 3, and to obtain a large effect on chip shrinkage as a consequence.

Use of the diffusion layer 2 as the power source interconnect also makes it possible to increase the power source capacity, and to obtain a large effect on countermeasures for EMI of the chip 4.

It is to be noted that, in the fabrication process of the above-described semiconductor device, an essential issue resides in accuracy in the process of opening the substrate contact hole 19 on the diffusion layer 2 preliminarily formed in the first Si substrate 1. It is preferable to preliminarily determine the arrangement of the diffusion layer 2 based on chip layout and wafer shot map, and to form the diffusion layer 2 as being aligned with the crystal orientation of the first Si substrate 1.

Another problem resides in alignment between the diffusion layer 2 and the second Si substrate 3. The crystal orientation of Si substrate (wafer) generally falls within a range of ±0.04 degrees away from the orientation flat (referred to as OF, hereinafter), and the second Si substrate 3 is disposed so as to be in parallel with the crystal orientation of the first Si substrate I making a reference to the OF. Accuracy in the parallelism between the direction in which Si substrate 3 is therefore adjustable within a range of ±0.04 degrees by forming the diffusion layer 2 as being aligned with the crystal orientation of the first Si substrate 1. From another aspect, it is necessary to form the substrate contact hole 19 on the second Si substrate 3 preliminarily taking a possible deviation in the parallelism into consideration, so that the diffusion layer 2 and the aluminum interconnect 8 on the second Si substrate 3 can be connected even if the parallelism between the direction in which the diffusion layer 2 extends and the crystal orientation of the second Si substrate 3 should shift by as much as ±0.04 degrees.

Still another problem resides in effects on the diffusion layers 2 exerted by the annealing carried out when the insulating film 9 and second Si substrate 3 are layered on the first Si substrate 1. The annealing inevitably causes spreading-by-diffusion of the diffusion layers 2 formed in the first Si substrate 1. The degree how far the diffusion layers 2 may spread by diffusion will vary depending on annealing temperature and annealing time. It is therefore necessary, as described in the above, to preliminarily estimate, through simulation, a possible degree of spreading-by-diffusion of the diffusion layers 2, and to sufficiently space the every adjacent diffusion layers 2 from each other, so as to avoid coupling of the adjacent diffusion layers 2 due to spreading-by-diffusion.

Figure 7:
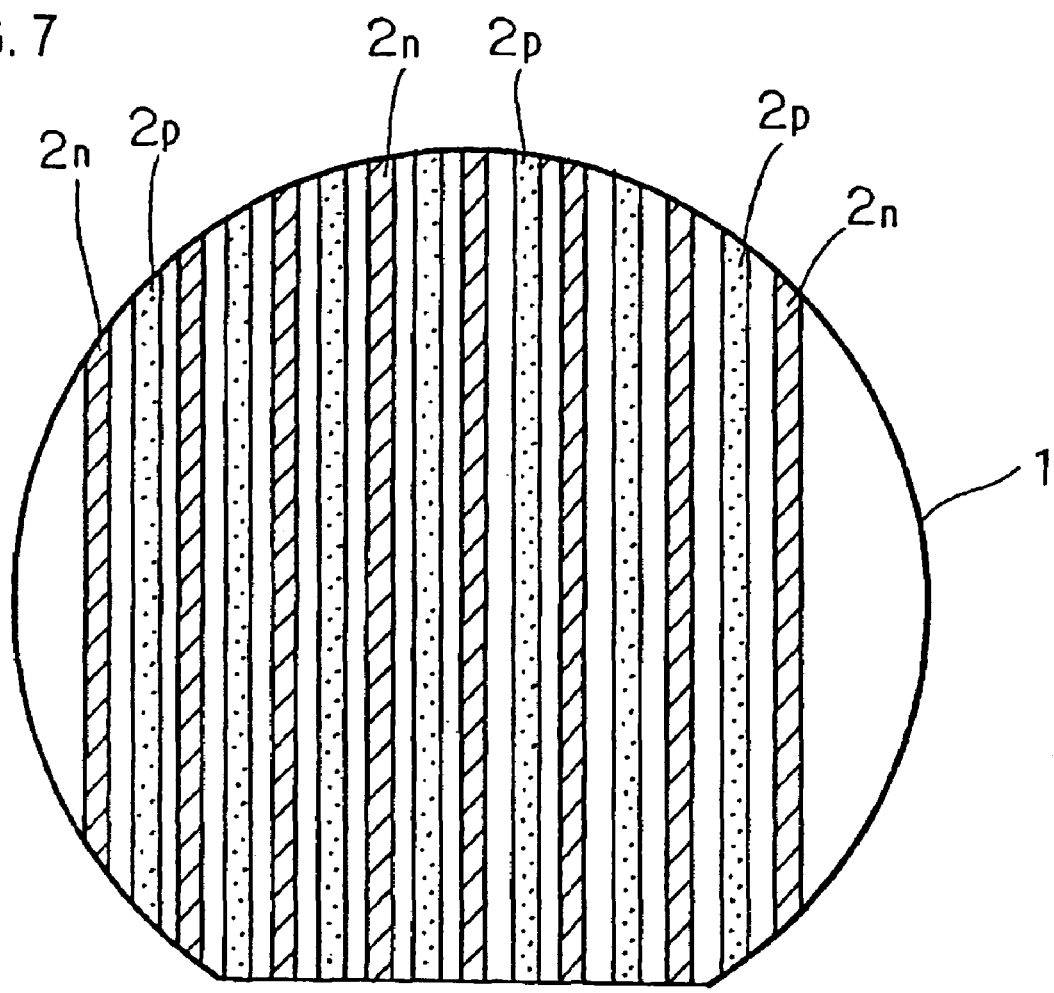
FIG. 7 is a drawing showing a state in which a $N^+$-type diffusion layer and $P^+$-type diffusion layer are formed in the surficial portion of a wafer-formed first Si substrate.

One possible technique of avoiding coupling of the adjacent diffusion layers 2 due to spreading-by-diffusion is such as forming, as shown in FIG. 7, $N^+$-type diffusion layers 2n in a stripe pattern in the wafer-formed first Si substrate 1, and by forming $P^+$-type diffusion layers 2p between every adjacent $N^+$-type diffusion layers 2n. The $P^+$-type diffusion layers 2p herein act as a stopper for the spreading-by-diffusion of the $N^+$-type diffusion layers 2n, and can prevent the $N^+$-type diffusion layers 2n from coupling with each other due to the spreading-by-diffusion.

Another aspect of the invention is directed to a semiconductor device including silicon on insulator (SOI) structure.

Such a device comprises a support substrate; a wiring layer, formed on said support substrate; an insulating layer formed on said support substrate and said wiring layer, said insulating layer being provided as a part of said SOI; a semiconductor substrate formed as a part of said SOI on said insulating layer, said semiconductor substrate having a first element and a first external terminal thereon, said element and said external terminal being coupled to said wiring layer.

In FIG. 1, the embodiment of the device of the invention is shown, where the support substrate corresponds to the first Si substrate, and the wiring layer is corresponds to the diffusion layer 2, and insulating layer corresponds to the $SiO_2$ film 9. The semiconductor substrate corresponds to the second Si substrate 3, which is formed on the $SiO_2$ film 9.

The device may contain plural elements such as MOSFET.

In FIG. 2B, the first (or second) element formed on the second Si substrate as the semiconductor substrate is shown. The element is coupled to the diffusion layer 2 as the wiring layer through the aluminum interconnect 8 as a conductive layer. Further, the external connection electrode 40 as the external terminal is also coupled to the diffusion layer 2 through the aluminum interconnect 8. The external connection electrode 40 may serve as a power source supply terminal.

As shown in FIG. 2A, a substrate-contact-forming region 5 is formed on the second Si substrate 3 as a first hole. The aluminum interconnect 8 is thus formed in the first hole. Then, the aluminum interconnect 8 is connected to the diffusion layer 2 through a plug, which is configured by filling a conductive material such as tungsten (so that tungsten 6 is formed) in a substrate-contact-forming hole 19 as a second hole formed in the $SiO_2$ film 9.

As shown in FIG. 3, the device contain plural elements, each of which is formed in corresponding device-forming region 30. Next to each element, the external connection electrode 40 and the tungsten as a plug formed in a substrate-contact-forming region 5 are configured. Those plugs are coupled between the diffusion layer 2 and the corresponding element. Further, in a planar arrangement, from the left side in FIG. 3 a first plug (tungsten 6) and the first element and the second element and the second plug (another tungsten 6) may be designed on the same line.

As shown in FIG. 7 and mentioned above, the diffusion layer may contain two types of regions, the first for N+-type as a first conductivity and the second for P+-type as a second conductivity, forming the stripe pattern in the wafer-formed first Si substrate 1.

What is claimed is:

1. A semiconductor device comprising:
a first semiconductor substrate as a support substrate;
a second semiconductor substrate which is layered on a first insulating film layered on one main surface of said first semiconductor substrate;
a diffusion layer formed at least in a part of the surficial portion of said first semiconductor substrate on the side thereof in contact with said first insulating film; and
a substrate-contact-forming region from which a part of said second semiconductor substrate is removed;
wherein the diffusion layer and the second semiconductor substrate are electrically connected in two locations.

2. The semiconductor device according to claim 1, further comprising:
a contact hole opened on said first semiconductor substrate so as to penetrate said first insulating film exposed in said substrate-contact-forming region; and
a support substrate interconnect disposed on said second semiconductor substrate so as to connect with said first semiconductor substrate through a contact configured by filling said contact hole with a conductive material.

3. The semiconductor device according to claim 2, wherein said contact hole includes a first contact hole opened in the region of said first semiconductor substrate having said diffusion layer formed therein, and a second contact hole opened in the region of said first semiconductor substrate not having said diffusion layer formed therein.

4. The semiconductor device according to claim 3, wherein said support substrate connection wiring includes a first support substrate interconnect connected to said contact configured in said first contact hole, and a second support substrate interconnect connected to said contact configured in said second contact hole.

5. A semiconductor device including silicon on insulator (SOI) structure, comprising:
a support substrate;
a wiring layer, formed on said support substrate;
an insulating layer formed on said support substrate and said wiring layer, said insulating layer being provided as a part of said SOI;
a semiconductor substrate formed as a part of said SOI on said insulating layer, said semiconductor substrate having a first element and a first external terminal thereon, said element and said external terminal being coupled to said wiring layer,
wherein said semiconductor substrate includes a second element and a second external terminal, said second element and external terminals being coupled to said wiring layer.

6. The semiconductor device according to claim 5, further comprising a first plug coupled between said wiring layer and said first element and a second plug coupled between said wiring layer and said second element,
wherein said first and second elements and said first and second plugs are designed on the same line in a planar arrangement.

7. The device as claimed in claim 5, wherein said wiring layer is a diffusion layer.

8. The device as claimed in claim 7, wherein said first external terminal is a power source supply terminal.

9. The device as claimed in claim 8, said device further comprising a conductive layer connected to said first element and coupled to said wiring layer.

10. The semiconductor device according to claim 9,
wherein said semiconductor substrate has a first hole, and
wherein said conductive layer is formed in said first hole.

11. The semiconductor device according to claim 10, further comprising a plug configured in a second hole formed in said insulating layer, thereby said conductive layer being connected to said wiring layer through said plug.

12. The device as claimed in claim 7, wherein said diffusion layer has a first diffusion region of a first conductivity type and a second diffusion region of a second conductivity type.

* * * * *